US009665478B2

(12) United States Patent
Conley

(10) Patent No.: US 9,665,478 B2
(45) Date of Patent: *May 30, 2017

(54) ZONE BOUNDARY ADJUSTMENTS FOR DEFECTS IN NON-VOLATILE MEMORIES

(75) Inventor: Kevin M. Conley, San Jose, CA (US)

(73) Assignee: INNOVATIVE MEMORY SYSTEMS, INC., Costa Mesa, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/552,227

(22) Filed: Oct. 24, 2006

(65) Prior Publication Data

US 2007/0047305 A1     Mar. 1, 2007

Related U.S. Application Data

(63) Continuation of application No. 11/114,996, filed on Apr. 26, 2005, now Pat. No. 7,149,871, which is a (Continued)

(51) Int. Cl.
G06F 12/00 (2006.01)
G06F 13/00 (2006.01)
(Continued)

(52) U.S. Cl.
CPC ...... G06F 12/0246 (2013.01); G11C 29/4401 (2013.01); G11C 29/76 (2013.01); G11C 29/808 (2013.01); G11C 16/04 (2013.01)

(58) Field of Classification Search
CPC . G06F 12/0246; G11C 16/04; G11C 29/4401; G11C 29/76; G11C 29/808
(Continued)

(56) References Cited

U.S. PATENT DOCUMENTS 5,172,338 A   12/1992   Mehrotra et al.
5,200,959 A   4/1993    Gross et al.
(Continued)

FOREIGN PATENT DOCUMENTS

EP   0 317 474 A   5/1989
GB   2 251 323 A   7/1992
(Continued)

OTHER PUBLICATIONS

International Search Report mailed Jun. 14, 2004.
(Continued)

*Primary Examiner* — Sheng-Jen Tsai
(74) *Attorney, Agent, or Firm* — Imperium Patent Works LLP; Mark D. Marrello

(57) ABSTRACT

A non-volatile memory is divided into logical zones by the card controller in order reduce the size of the data structures it uses for address translation. Zone boundaries are adjusted to accommodate defects allowed by memory test to improve card yields and to adjust boundaries in the field to extend the usable lifetime of the card. Firmware scans for the presence of defective blocks on the card. Once the locations of these blocks are known, the firmware calculates the zone boundaries in such a way that good blocks are equally distributed among the zones. Since the number of good blocks meets the card test criteria by the memory test criteria, defects will reduce card yield fallout. The controller can perform dynamic boundary adjustments. When defects occur, the controller can perform the analysis again and, if needed, redistributes the zone boundaries, moving any user data.

11 Claims, 6 Drawing Sheets

Related U.S. Application Data continuation of application No. 10/315,451, filed on Dec. 9, 2002, now Pat. No. 6,901,498.

(51) Int. Cl.
*G06F 13/28* (2006.01)
*G06F 12/02* (2006.01)
*G11C 29/44* (2006.01)
*G11C 29/00* (2006.01)
*G11C 16/04* (2006.01)

(58) Field of Classification Search
USPC ............... 711/103, 173, 201, 172; 714/7, 8; 365/230.01, 230.04
See application file for complete search history.

(56) References Cited

U.S. PATENT DOCUMENTS

| | | |
|---|---|---|
| 5,270,979 A | 12/1993 | Harari et al. |
| 5,315,541 A | 5/1994 | Harari et al. |
| 5,422,855 A | 6/1995 | Eslick et al. |
| 5,428,621 A | 6/1995 | Mehrotra et al. |
| 5,430,859 A | 7/1995 | Norman et al. |
| 5,532,962 A | 7/1996 | Auclair et al. |
| 5,602,987 A | 2/1997 | Harari et al. |
| 5,627,783 A | 5/1997 | Miyauchi |
| 5,663,901 A | 9/1997 | Wallace et al. |
| 5,677,872 A | 10/1997 | Samachisa et al. |
| 5,712,179 A | 1/1998 | Yuan |
| 5,712,180 A | 1/1998 | Guterman et al. |
| 5,724,284 A | 3/1998 | Bill et al. |
| 5,860,124 A * | 1/1999 | Matthews ............ G06F 3/0619 711/159 |
| 5,881,003 A | 3/1999 | Kirihata et al. |
| 5,890,192 A | 3/1999 | Lee et al. |
| 5,930,167 A | 7/1999 | Lee et al. |
| 5,943,693 A | 8/1999 | Barth |
| 5,956,473 A * | 9/1999 | Ma et al. ........................ 714/5 |
| 6,000,006 A * | 12/1999 | Bruce et al. .................. 711/103 |
| 6,161,163 A | 12/2000 | Komatsu |
| 6,199,177 B1 | 3/2001 | Blodgett |
| 6,252,800 B1 | 6/2001 | Chida |
| 6,275,436 B1 | 8/2001 | Tobita et al. |
| 6,367,030 B1 | 4/2002 | Yamauchi |
| 6,377,500 B1 | 4/2002 | Fujimoto et al. |
| 6,426,893 B1 | 7/2002 | Conley et al. |
| 6,584,579 B1 * | 6/2003 | Komatsu et al. .................. 714/7 |
| 6,591,328 B1 * | 7/2003 | Iida et al. ..................... 711/103 |
| 6,687,784 B2 | 2/2004 | Douniwa et al. |
| 6,845,438 B1 * | 1/2005 | Tanaka et al. ............... 711/206 |
| 6,901,498 B2 * | 5/2005 | Conley ............... G06F 12/0246 711/173 |
| 7,096,313 B1 * | 8/2006 | Chang et al. ................. 711/103 |
| 7,120,729 B2 * | 10/2006 | Gonzalez et al. ............ 711/103 |
| 7,149,871 B2 * | 12/2006 | Conley ............... G06F 12/0246 711/173 |
| 2001/0015908 A1 | 8/2001 | Katayama |
| 2002/0099995 A1 * | 7/2002 | Furukawa ..................... 714/766 |
| 2004/0083335 A1 * | 4/2004 | Gonzalez et al. ............ 711/103 |

FOREIGN PATENT DOCUMENTS

| | | |
|---|---|---|
| JP | 02-292798 | 12/1990 |
| JP | 11-096799 | 4/1999 |
| JP | 11-110283 | 4/1999 |
| JP | 2002-073409 | 3/2002 |
| TW | 436795 | 5/2001 |

OTHER PUBLICATIONS

International Search Report, International Application No. PCT/US03/38392 mailed Aug. 2, 2004.
Communication Pursuant to Article 94(3) EPC, European Application No. 03790271.5, dated Oct. 29, 2009, 3 pages.
Communication Pursuant to Article 94(3) EPC, European Application No. 03790271.5, dated Jun. 2, 2010, 3 pages.
Korean Office Action for Korean Patent Application No. 2005-7010359 dated Jan. 19, 2010, 2 pages.
Chinese Office Action for Application No. 200380109302.2, dated Jun. 24, 2008, 9 pages.
Taiwanese Office Action, Patent Application No. 92134378, dated Feb. 13, 2009, 13 pages.
Taiwanese Office Action, Patent Application No. 92134378, dated Jun. 5, 2009, 3 pages.
Japanese Office Action, Patent Application No. 2004-559246, dated Jun. 1, 2009, 4 pages.
European Search Report for European Application No. EP 03790271, dated Sep. 24, 2007, 1 page.
Examiner's Report for European Application No. EP0379271, dated Oct. 23, 2007, 1 page.
European Office Action for Application No. 03 790 271.5, dated Aug. 18, 2008, 2 pages.

* cited by examiner

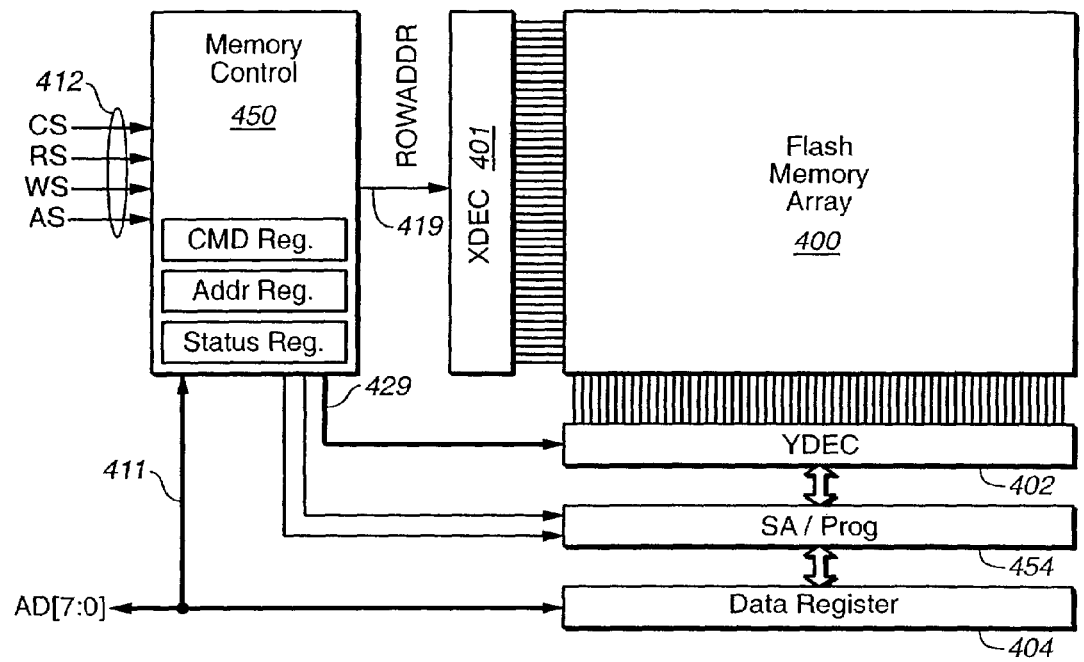
FIG._1
(PRIOR ART)
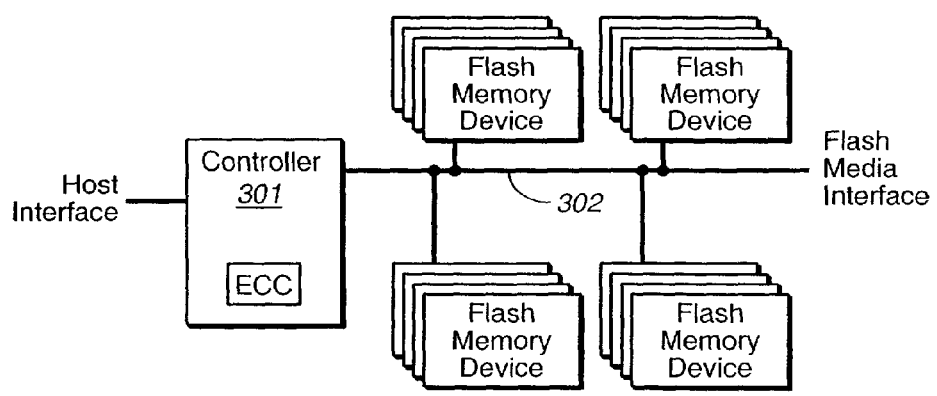
FIG._2
(PRIOR ART)

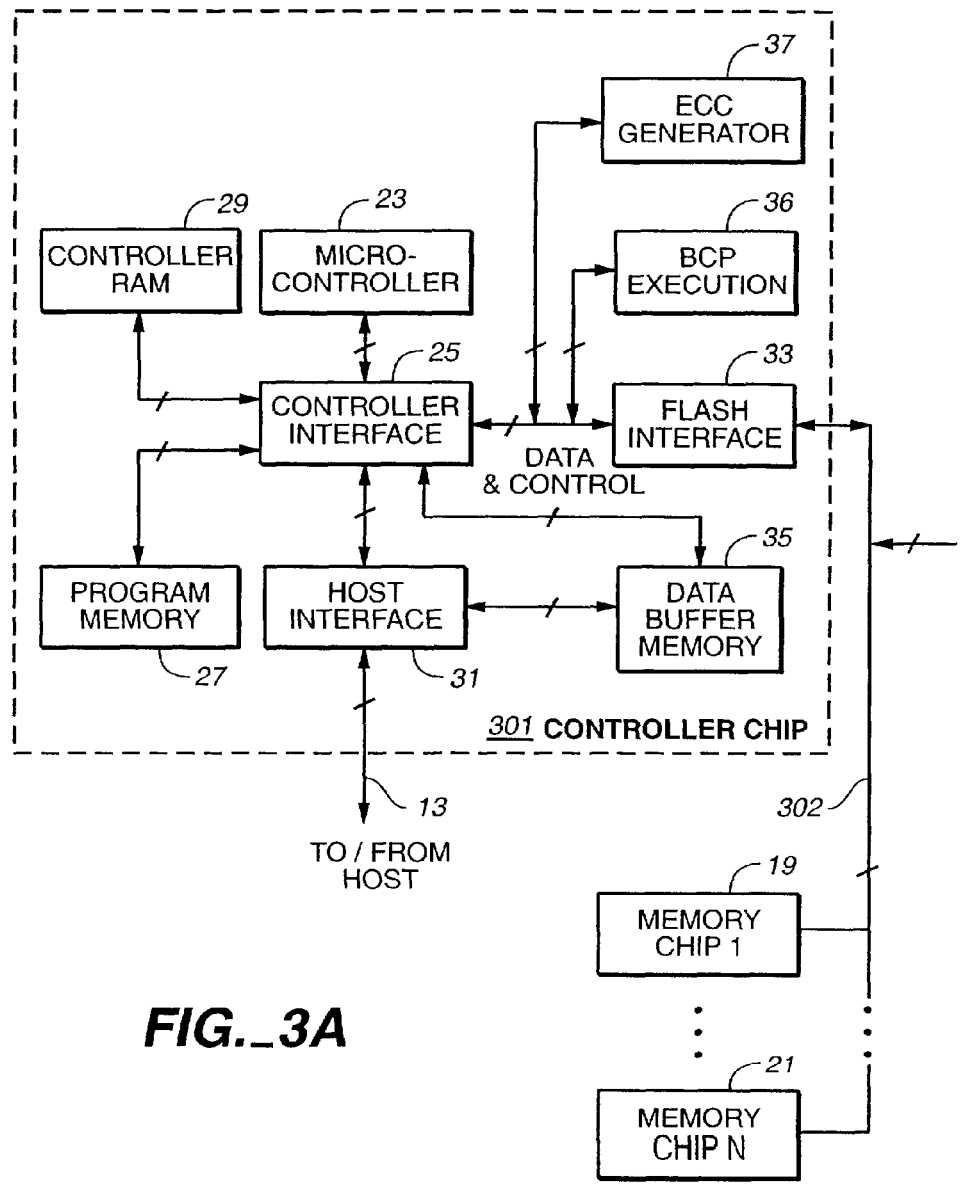
FIG._3A
FIG._3

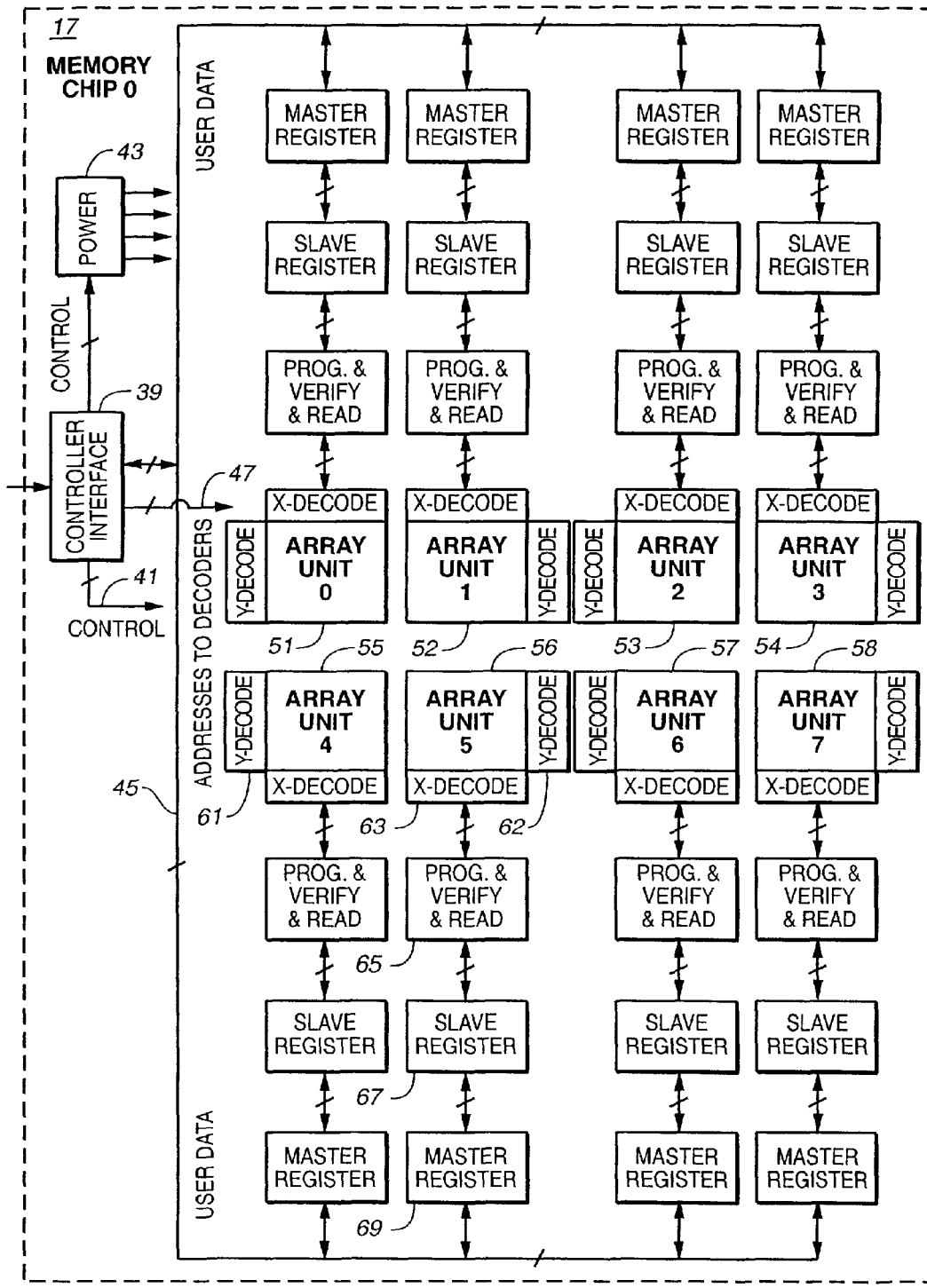
FIG._3B

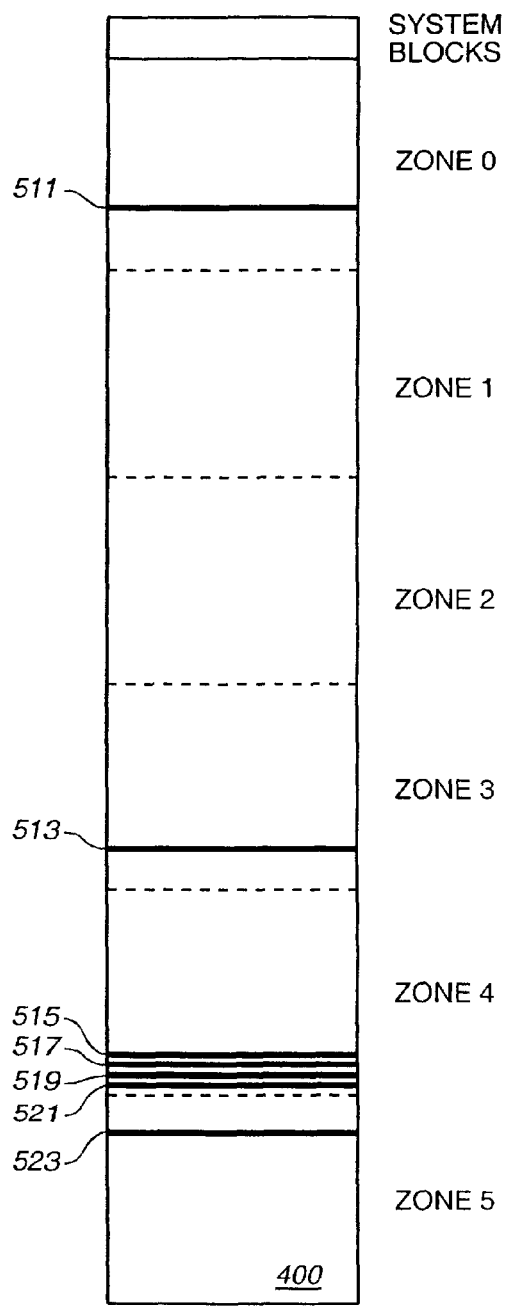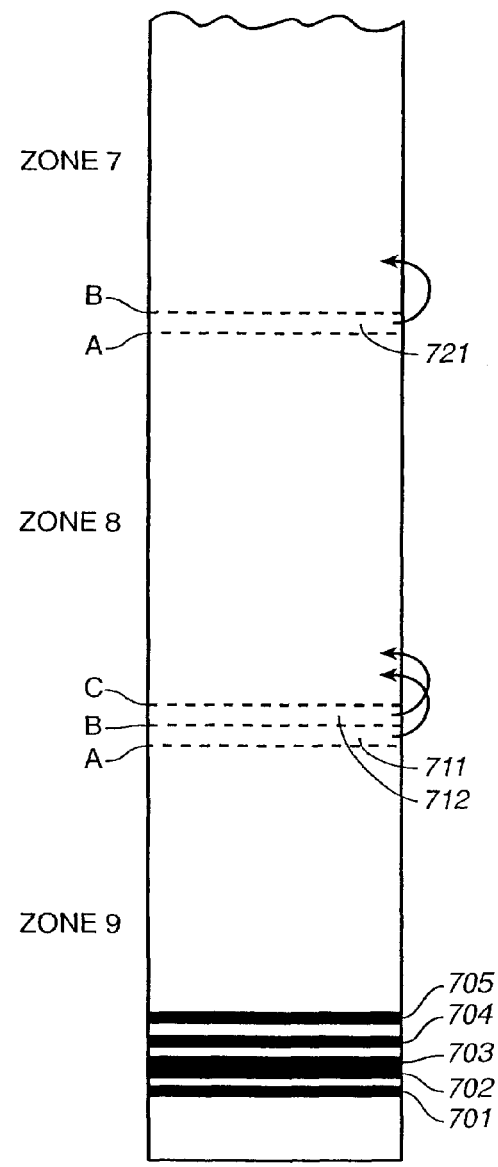
FIG._4  FIG._6

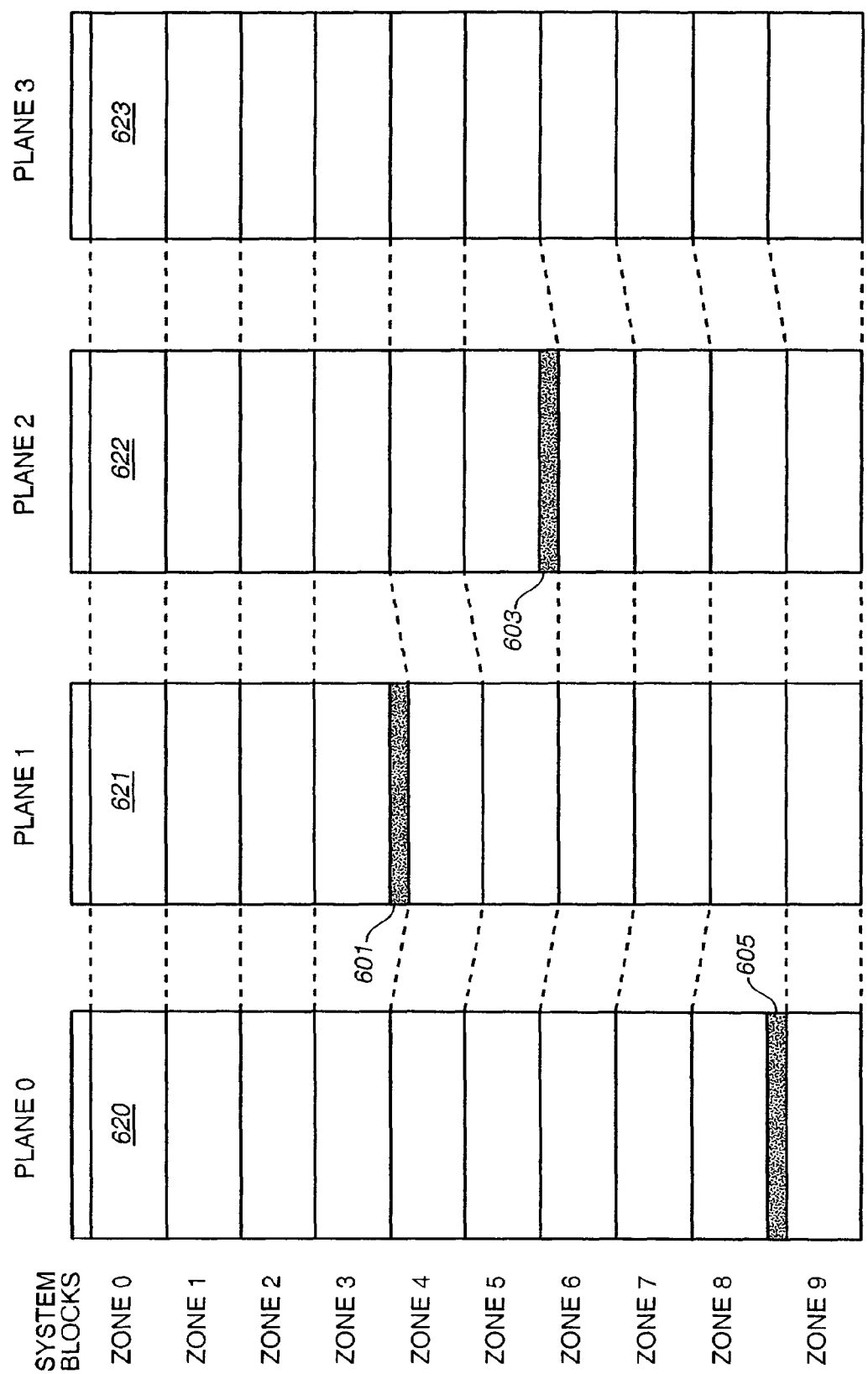
FIG._5

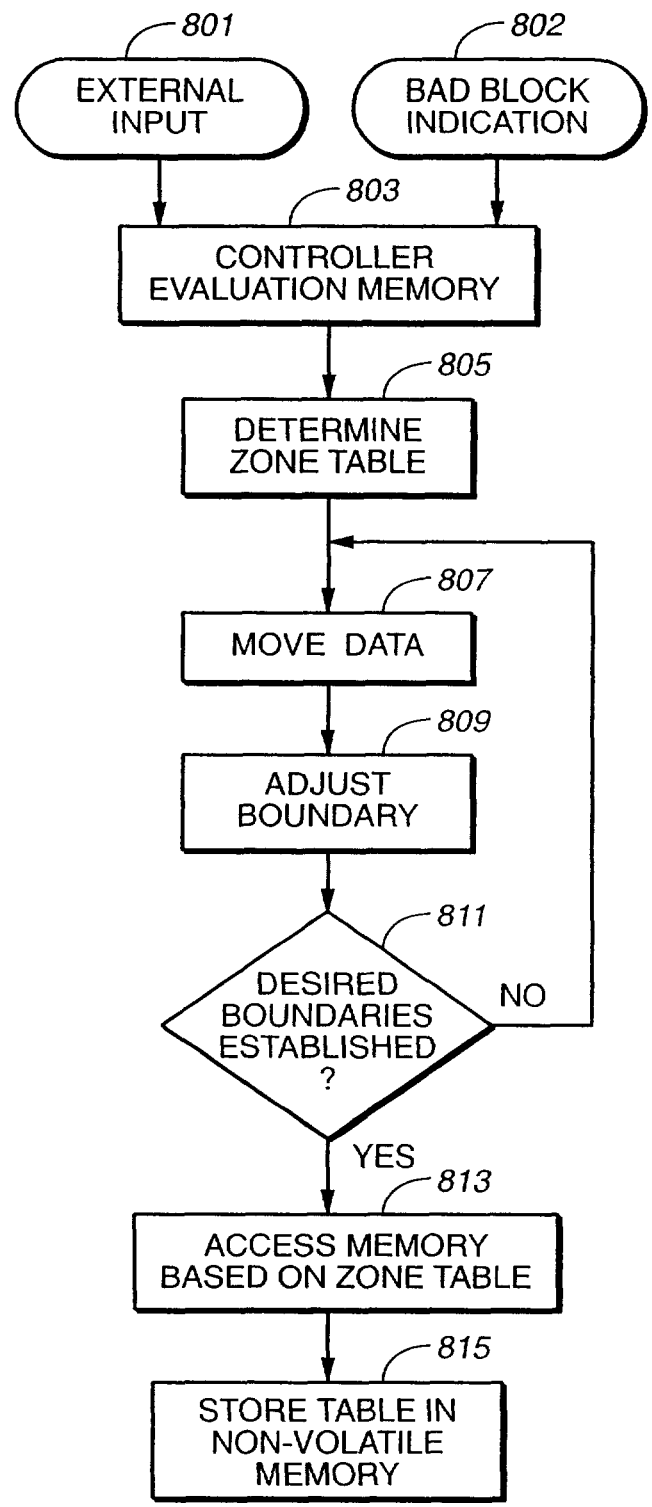
FIG._7

ZONE BOUNDARY ADJUSTMENTS FOR DEFECTS IN NON-VOLATILE MEMORIES

CROSS REFERENCE TO RELATED APPLICATIONS

This application is a continuation of application Ser. No. 11/114,996, filed on Apr. 26, 2005, which is a continuation of application Ser. No. 10/315,451, filed on Dec. 9, 2002. These applications are all incorporated herein by reference in their entirety for all purposes.

BACKGROUND OF THE INVENTION

This invention pertains to the field of semiconductor non-volatile data storage system architectures and their methods of operation, and has application to data storage systems based on flash electrically erasable and programmable read-only memories (EEPROMs).

A common application of flash EEPROM devices is as a mass data storage subsystem for electronic devices. Such subsystems are commonly implemented as either removable memory cards that can be inserted into multiple host systems or as non-removable embedded storage within the host system. In both implementations, the subsystem includes one or more flash devices and often a subsystem controller.

Flash EEPROM devices are composed of one or more arrays of transistor cells, each cell capable of non-volatile storage of one or more bits of data. Thus flash memory does not require power to retain the data programmed therein. Once programmed however, a cell must be erased before it can be reprogrammed with a new data value. These arrays of cells are partitioned into groups to provide for efficient implementation of read, program and erase functions. A typical flash memory architecture for mass storage arranges large groups of cells into erasable blocks, wherein a block contains the smallest number of cells (unit of erase) that are erasable at one time.

In one commercial form, each block contains enough cells to store one sector of user data plus some overhead data related to the user data and/or to the block in which it is stored. The amount of user data included in a sector is the standard 512 bytes in one class of such memory systems but can be of some other size. Because the isolation of individual blocks of cells from one another that is required to make them individually erasable takes space on the integrated circuit chip, another class of flash memories makes the blocks significantly larger so there is less space required for such isolation. But since it is also desired to handle user data in much smaller sectors, each large block is often further partitioned into individually addressable pages that are the basic unit for reading and programming user data. Each page usually stores one sector of user data, but a page may store a partial sector or multiple sectors. A "sector" is used herein to refer to an amount of user data that is transferred to and from the host as a unit.

The subsystem controller in a large block system performs a number of functions including the translation between logical addresses (LBAs) received by the memory sub-system from a host, and physical block numbers (PBNs) and page addresses within the memory cell array. This translation often involves use of intermediate terms for a logical block number (LBN) and logical page. The controller also manages the low level flash circuit operation through a series of commands that it issues to the flash memory devices via an interface bus. Another function the controller performs is to maintain the integrity of data stored to the subsystem through various means, such as by using an error correction code (ECC).

FIG. 1 shows a typical internal architecture for a flash memory device 131. The primary features include an input/output (I/O) bus 411 and control signals 412 to interface to an external controller, a memory control circuit 450 to control internal memory operations with registers for command, address and status signals. One or more arrays 400 of flash EEPROM cells are included, each array having its own row decoder (XDEC) 401 and column decoder (YDEC) 402, a group of sense amplifiers and program control circuitry (SA/PROG) 454 and a data register 404. Presently, the memory cells usually include one or more conductive floating gates as storage elements but other long term electron charge storage elements may be used instead. The memory cell array may be operated with two levels of charge defined for each storage element to therefore store one bit of data with each element. Alternatively, more than two storage states may be defined for each storage element, in which case more than one bit of data is stored in each element.

If desired, a plurality of arrays 400, together with related X decoders, Y decoders, program/verified circuitry, data registers, and the like are provided, for example as taught by U.S. Pat. No. 5,890,192, issued Mar. 30, 1999, and assigned to SanDisk Corporation, the assignee of this application, which is hereby incorporated by this reference. Related memory system features are described in co-pending patent application Ser. No. 09/505,555, filed Feb. 17, 2000 by Kevin Conley et al., which application is expressly incorporated herein by this reference.

The external interface I/O bus 411 and control signals 412 can include the following:

CS—Chip Select. Used to activate flash memory interface.

RS—Read Strobe. Used to indicate the I/O bus is being used to transfer data from the memory array.

WS—Write Strobe. Used to indicate the I/O bus is being used to transfer data to the memory array.

AS—Address Strobe. Indicates that the I/O bus is being used to transfer address information.

AD[7:0]—Address/Data Bus This I/O bus is used to transfer data between controller and the flash memory command, address and data registers of the memory control 450.

In addition to these signals, it is also typical that the memory has a means by which the storage subsystem controller may determine that the memory is busy performing some task. Such means could include a dedicated signal or a status bit in an internal memory register that is accessible while the memory is busy.

This interface is given only as an example as other signal configurations can be used to give the same functionality. FIG. 1 shows only one flash memory array 400 with its related components, but a multiplicity of such arrays can exist on a single flash memory chip that share a common interface and memory control circuitry but have separate XDEC, YDEC, SA/PROG and DATA REG circuitry in order to allow parallel read and program operations.

Data is transferred from the memory array through the data register 404 to an external controller via the data registers' coupling to the I/O bus AD[7:0] 411. The data register 404 is also coupled the sense amplifier/programming circuit 454. The number of elements of the data register coupled to each sense amplifier/programming circuit element may depend on the number of bits stored in each storage element of the memory cells, flash EEPROM cells each containing one or more floating gates as the storage elements. Each storage element may store a plurality of bits, such as 2 or 4, if the memory cells are operated in a multi-state mode. Alternatively, the memory cells may be operated in a binary mode to store one bit of data per storage element.

The row decoder 401 decodes row addresses for the array 400 in order to select the physical page to be accessed. The row decoder 401 receives row addresses via internal row address lines 419 from the memory control logic 450. A column decoder 402 receives column addresses via internal column address lines 429 from the memory control logic 450.

FIG. 2 shows an architecture of a typical non-volatile data storage system, in this case employing flash memory cells as the storage media. In one form, this system is encapsulated within a removable card having an electrical connector extending along one side to provide the host interface when inserted into a receptacle of a host. Alternatively, the system of FIG. 2 may be embedded into a host system in the form of a permanently installed embedded circuit or otherwise. The system utilizes a single controller 101 that performs high-level host and memory control functions. The flash memory media is composed of one or more flash memory devices, each such device often formed on its own integrated circuit chip. The system controller and the flash memory are connected by a bus 121 that allows the controller 101 to load command, address, and transfer data to and from the flash memory array. (The bus 121 includes 412 and 411 of FIG. 1.) The controller 101 interfaces with a host system (not shown) with which user data is transferred to and from the flash memory array. In the case where the system of FIG. 2 is included in a card, the host interface includes a mating plug and socket assembly (not shown) on the card and host equipment.

The controller 101 receives a command from the host to read or write one or more sectors of user data starting at a particular logical address. This address may or may not align with the first physical page in a block of memory cells.

In some prior art systems having large capacity memory cell blocks that are divided into multiple pages, the data from a block that is not being updated needs to be copied from the original block to a new block that also contains the new, updated data being written by the host. In other prior art systems, flags are recorded with the user data in pages and are used to indicate that pages of data in the original block that are being superceded by the newly written data are invalid. A mechanism by which data that partially supercedes data stored in an existing block can be written without either copying unchanged data from the existing block or programming flags to pages that have been previously programmed is described in co-pending patent application "Partial Block Data Programming and Reading Operations in a Non-Volatile Memory", Ser. No. 09/766,436, filed Jan. 19, 2001 by Kevin Conley, which application is expressly incorporated herein by this reference.

Non-volatile memory systems of this type are being applied to a number of applications, particularly when packaged in an enclosed card that is removable connected with a host system. Current commercial memory card formats include that of the Personal Computer Memory Card International Association (PCMCIA), CompactFlash (CF), MultiMediaCard (MMC) and Secure Digital (SD). One supplier of these cards is SanDisk Corporation, assignee of this application. Host systems with which such cards are used include personal computers, notebook computers, hand-held computing devices, cameras, audio reproducing devices, and the like. Flash EEPROM systems are also utilized as bulk mass storage embedded in host systems.

Such non-volatile memory systems include one or more arrays of floating-gate memory cells and a system controller. The controller manages communication with the host system and operation of the memory cell array to store and retrieve user data. The memory cells are grouped together into blocks of cells, a block of cells being the smallest grouping of cells that are simultaneously erasable. Prior to writing data into one or more blocks of cells, those blocks of cells are erased. User data are typically transferred between the host and memory array in sectors. A sector of user data can be any amount that is convenient to handle, preferably less than the capacity of the memory block, often being equal to the standard disk drive sector size, 512 bytes. In one commercial architecture, the memory system block is sized to store one sector of user data plus overhead data, the overhead data including information such as an error correction code (ECC) for the user data stored in the block, a history of use of the block, defects and other physical information of the memory cell block. Various implementations of this type of non-volatile memory system are described in the following United States patents and pending applications assigned to SanDisk Corporation, each of which is incorporated herein in its entirety by this reference: U.S. Pat. Nos. 5,172,338, 5,602,987, 5,315,541, 5,200,959, 5,270,979, 5,428,621, 5,663,901, 5,532,962, 5,430,859 and 5,712,180, and application Ser. No. 08/910,947, filed Aug. 7, 1997, and application Ser. No. 09/343,328, filed Jun. 30, 1999. Another type of non-volatile memory system utilizes a larger memory cell block size that stores multiple sectors of user data.

One architecture of the memory cell array conveniently forms a block from one or two rows of memory cells that are within a sub-array or other unit of cells and which share a common erase gate. U.S. Pat. Nos. 5,677,872 and 5,712,179 of SanDisk Corporation, which are incorporated herein in their entirety, give examples of this architecture. Although it is currently most common to store one bit of data in each floating gate cell by defining only two programmed threshold levels, the trend is to store more than one bit of data in each cell by establishing more than two floating-gate transistor threshold ranges. A memory system that stores two bits of data per floating gate (four threshold level ranges or states) is currently available, with three bits per cell (eight threshold level ranges or states) and four bits per cell (sixteen threshold level ranges) being contemplated for future systems. Of course, the number of memory cells required to store a sector of data goes down as the number of bits stored in each cell goes up. This trend, combined with a scaling of the array resulting from improvements in cell structure and general semiconductor processing, makes it practical to form a memory cell block in a segmented portion of a row of cells. The block structure can also be formed to enable selection of operation of each of the memory cells in two states (one data bit per cell) or in some multiple such as four states (two data bits per cell), as described in SanDisk Corporation U.S. Pat. No. 5,930,167, which is incorporated herein in its entirety by this reference.

Since the programming of data into floating-gate memory cells can take significant amounts of time, a large number of memory cells in a row are typically programmed at the same time. But increases in this parallelism cause increased power requirements and potential disturbances of charges of adjacent cells or interaction between them. U.S. Pat. No. 5,890,192 of SanDisk Corporation, which is incorporated above, describes a system that minimizes these effects by simultaneously programming multiple pages (referred to as chunks in that patent) of data into different blocks of cells located in different operational memory cell units (sub-arrays). Memory systems capable of programming multiple pages in parallel into multiple sub-array units are described in co-pending patent application Ser. No. 09/505,555, filed Feb. 17, 2000 by Kevin Conley et al., which is incorporated by reference above, and Ser. No. 09/759,835, filed Jan. 10, 2001, by John Mangan et al., which application is expressly incorporated herein by this reference.

More detail on a specific embodiment of FIG. 2 is shown in FIG. 3. This particular embodiment divides the memory array 400 into a number of "planes", where a plane is a subdivision of the memory on a single die. Only the more relevant portions of FIG. 3 will be described here. More detail can be found U.S. patent application Ser. No. 09/759,835 that was incorporated by reference in the previous paragraph.

The non-volatile memory chip 17 includes a logic circuit 39 for interfacing with the controller through the lines 302. Additional components of the memory chip are not shown for simplicity in explanation. The purpose of the logic circuit 39 is to generate signals in separate buses and control lines. Various control signals are provided in lines 41 and a power supply 43 to the memory array circuits is also controlled through the interface 39. A data bus 45 carries user data being programmed into or read from the non-volatile memory, and an address bus 47 carries the addresses of the portion of the memory being accessed for reading user data, writing user data, or erasing blocks of memory cells.

The floating gate memory cell array of a single non-volatile memory chip is itself divided into a number of units that each have its own set of supporting circuits for addressing, decoding, reading and the like. In this example, eight such array units 0-7, denoted by reference numbers 51-58, are illustrated. Physically, as an example, the memory array on a single chip is divided into quadrants, or "planes", each quadrant including two units that are in part connected together and share a common word line decoding circuits (y-decode), such as the y-decoders 61 and 62 on either side of memory cell units 4 (55) and 5 (56). The common word lines run across both memory cell units 4 (55) and 5 (56), with half connected to the y-decoder 61 on one side and half connected to y-decoder 62 on the other side, as described further below, with respect to FIG. 3. This memory architecture is similar to that described in U.S. Pat. No. 5,890,192 incorporated by reference above, except there are eight units, or "planes", instead of the four units (quads) illustrated in that patent.

A number of architectures are used for non-volatile memories arrays, such as 400 (FIG. 1) or 51-58 (FIG. 3). A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference or which have been previously incorporated above: U.S. Pat. Nos. 5,095,344, 5,172,338, 5,602,987, 5,663,901, 5,430,859, 5,657,332, 5,712,180, 5,890,192, and 6,151,248, and Ser. No. 09/505,555, filed Feb. 17, 2000, and Ser. No. 09/667,344, filed Sep. 22, 2000.

A NAND array of one design has a number of memory cells, such as 8, 16 or even 32, connected in series string between a bit line and a reference potential through select transistors at either end. Word lines are connected with control gates of cells in different series strings. Relevant examples of such arrays and their operation are given in the following U.S. patent application Ser. No. 09/893,277, filed Jun. 27, 2001, that is also hereby incorporated by reference, and references contained therein.

A memory will often have defective portions, either from the manufacturing process or that arise during the operation of the device. A number of techniques exist for managing these defects, such as with error correction code or by remapping portions of the memory, such as described in U.S. Pat. No. 5,602,987, that was incorporated by reference above, or U.S. Pat. Nos. 5,315,541, 5,200,959, and 5,428,621, that are hereby incorporated by reference. For instance, a device is generally thoroughly tested before being shipped. The testing may find a defective portion of the memory that needs to be eliminated. Before shipping the device, the information on these defects can be stored on the device, for example in a ROM area of the memory array or separate ROM, and at power up it is read by controller and then used so that the controller can substitute a good portion of the memory for the bad. When reading or writing, the controller will then need to refer to a pointer structure in controller for this re-mapping.

Memories are often designed with a number of redundant blocks to replace defective blocks. These are generally distributed between the logical structure areas of the memory. However, if the number of bad blocks is too large, or too unevenly distributed, this results in yield loses or downgrades the capacity of the card.

SUMMARY OF THE INVENTION

According to one principal aspect of the present invention, briefly and generally, a non-volatile memory, such as a flash memory, is divided into logical zones by the card controller in order reduce the size of the data structures it uses for address translation. The present invention presents methods to adjust the zone boundaries to accommodate defects allowed by memory test to improve card yields and to adjust boundaries in the field to extend the usable lifetime of the card. At the time of card production, an operation is performed that sets zone boundaries. During this process, the firmware scans for the presence of defective blocks on the card. Once the locations of all the blocks are known, the firmware calculates the zone boundaries in such a way that good blocks are equally distributed among the zones. Since the number of good blocks meets the card test criteria by the memory test criteria, defects will reduce card yield fallout.

In another aspect of the present invention, the controller can perform dynamic boundary adjustments. When defects occur, the controller performs the analysis again and, if the number of good blocks becomes unbalanced, redistributes the zone boundaries, moving any user data. The process can be reformed based on a timing mechanism, such as the number of program or erase cycles, in response to an error correction code (ECC) result, or an indication of programming or erase difficulties, such as verification failure.

Additional aspects, features and advantages of the present invention are included in the following description of exemplary embodiments, which description should be read in conjunction with the accompanying drawings.

BRIEF DESCRIPTION OF THE DRAWINGS

FIG. 1 is a block diagram of a typical prior art flash EEPROM memory array with memory control logic, data and address registers.

FIG. 2 illustrates an architecture utilizing memories of FIG. 1 with a system controller.

FIG. 3 illustrates some elements of a non-volatile memory.

FIG. 4 illustrates an arrangement of bad blocks in a single plane embodiment.

FIG. 5 shows an example of boundary adjustment in a four plane, ten zone embodiment.

FIG. 6 is a schematic illustration of how boundaries can be realigned.

FIG. 7 is a flow chart illustrating an exemplary embodiment.

DESCRIPTION OF EXEMPLARY EMBODIMENTS OF THE INVENTION

The various aspects of the present invention are applicable to non-volatile memory systems in general. Although the description below, as well as that in the Background, is given mainly in terms of an EEPROM Flash memory embodiment, the particular type of storage unit used in the memory array is not particularly important in the present invention. The particulars of how the storage elements are read, are written, and store data do not enter in to the main aspects of the present invention and can be those of any of the various non-volatile systems.

In the following, as in the Background section, the following terminology is used: a block contains the smallest number of cells (unit of erase) that are erasable at one time, a sector is used herein to refer to an amount of user data that is transferred to and from the host as a unit, a page is the basic unit for reading and programming user data, and a plane is physical subdivision of the memory on a single die. Although in some embodiments, some of these structures correspond, either directly or through a logical to physical correspondence, to one another, they are conceptually distinct. Additionally, in the more general case, a read page and a write page may be distinct. In the present discussion, the additional term a "zone" is used for a logical subdivision of the total capacity of the die. In a main aspect of the current invention, logically an address is distributed over the planes but the physical boundaries of a zone within a plane are independent and are optimized for the location of defects.

In the exemplary embodiment of the present invention, a flash or other memory device, such as 17 in FIG. 3, is divided into logical zones by the card controller 301 in order reduce the size of the data structures it uses for address translation. Within a zone, a certain number of physical blocks are often included beyond the logical capacity of the zone in order to provide an erase pool used for write operations. Since the logical zones and their defect tolerances may not align to the number of defects in each zone found during memory testing, it is possible to suffer yield loss due to having excessive defects in a zone. In addition, defects can occur during operation of the card that can cause a zone to be unusable thus limiting the lifetime of the card. A principle aspect of the present invention is to adjust the zone boundaries to accommodate defects allowed by memory test to improve card yields and to adjust boundaries in the field to extend the usable lifetime of the card.

The situation is illustrated schematically in FIG. 4 for a memory array 400 having a single plan that is logically divided into six zones, indicated by broken lines, plus a number of system blocks devoted to overhead and other non-user data. A number of bad blocks, 511-523, are illustrated by a blackened strip. For example, bad block 511 in ZONE0 and bad block 513 in ZONE3 can be a pair of blocks that were acceptable when the device was initially tested, but which failed as the device was used; while bad blocks 515, 517, 519, and 521 in ZONE4 and bad block 523 in ZONE5 can be blocks that were bad at initial testing due to, say, processing errors during manufacture. If each zone is allotted three spare blocks, ZONE4 will not have enough good blocks to correspond to its logical assignments.

One approach to this problem is to provide more spare blocks, but this is a trade off between wasted space (and consequently cost) versus reliability. Although it is standard practice to include a number of spare or redundant blocks in an array, there is usually a limit beyond where this becomes counterproductive. Furthermore, when an array is logically divided into sub-units, such as the zone structure described here, the spare blocks are typically distributed uniformly across the sub-units. However, the defective blocks may be clustered in a given sub-unit, either through randomness or due to processing or other problems that affect a limited area. Consequently, the number of spare blocks may be spread too thin in one zone while another zone maintains its original excess number of spare blocks.

A previous approach to this problem involved assigning boundaries at the same time as the memory testing, for example moving a boundary for ZONE4 to add the need extra good block. This limits flexibility in reducing zones to better meet cost requirements of controller memory. Another approach is to suffer yield loses or downgrade the capacity of the card.

In a principle aspect of the present invention, the controller scans for the presence of defective blocks on the card. This can be done at the time of card production with an operation performed that sets zone boundaries. In an exemplary embodiment, this is implemented in firmware, although hardware and software implementations are variations. Once the locations of all the blocks are known, the firmware calculates the zone boundaries in such a way that good blocks are equally distributed among the zones. Since the number of good blocks is guaranteed to meet the card test criteria by the memory test criteria, defects will cause no card yield fallout. When defects occur, the controller performs the analysis again and, if the number of good blocks becomes unbalanced, redistributes the zone boundaries, moving any user data.

For example, in FIG. 4, at test time, the boundary between ZONE4 and ZONE3 can be moved to provide ZONE4 with additional non-defective blocks. If bad block 513 or additional bad blocks in ZONE3 develop over time, the controller can subsequently move up the ZONE3-ZONE2 boundary to insure sufficient good blocks in the array.

Since each zone is typically provided with enough spare blocks to allow a reasonable number of defective blocks, when the array is contained in a single plain there is usually enough reserve so that boundaries will generally not require much movement. However, when the zones are distributed across several planes, these margins can become spread quite thin. For example, if each zone is allotted eight extra blocks, a single-plane embodiment as in FIG. 4 would allow up to all eight defective blocks in the zone before the zone becomes unusable with boundary adjustment. If instead, each zone is distributed across four planes, that portion of each zone in a particular plane can tolerate at most two defects.

The use of planes is discussed above in the Background. In order to improve performance by reducing programming time, a goal is to program as many cells in parallel as can reasonably be done without incurring other penalties. One implementation is the use of planes that divide the memory array into largely independent sub-arrays or units, each unit in turn being divided into a large number of blocks, as described in U.S. patent application Ser. No. 09/505,555, filed Feb. 17, 2000, by Kevin Conley et al. and Ser. No. 09/759,835, filed Jan. 10, 2001, by John Mangan et al., which are incorporated by reference above. Pages of data are then programmed at the same time into more than one of the units. Another configuration further combines one or more of these units from multiple memory chips. These multiple chips may be connected to a single bus (as shown in FIG. 2) or multiple independent busses for higher data throughput.

An extension of this is to link blocks from different units for programming, reading and erasing together, as described in U.S. patent application Ser. No. 09/766,436, filed Jan. 19, 2001, which is incorporated by reference above. In this arrangement, blocks from different units can be operated together as a metablock. A metablock, and consequently a zone, can cross multiple planes and each plane need not be in the same physical device. The multiple dies can be operated in parallel independently of how they are actually packaged.

As with the memory embodiments described above, each block, the smallest erasable group of the memory array, is typically divided into multiple pages, a page containing the smallest number of cells that are programmable together within the block. Therefore, a programming operation of a metablock will usually include the simultaneously programming of data into at least one page of each of the blocks forming the metablock, which is repeated until the metablock is full or the incoming data has all been programmed. Other metablocks are formed of different blocks from the array units, one block from each unit. The extensions discussed below can all be combined with metablock operation and its extensions, such as those discussed in U.S. patent application Ser. No. 10/081,375, filed Feb. 22, 2002, which is hereby incorporated by reference.

FIG. 5 shows an exemplary embodiment with ten zones, each of which is distributed across four planes. For example, Zone 0 is made up of portions 620, 621, 622, and 623 that together make up the logical structure of a single zone. Bad blocks are shown in Zone 3, PLANE 1 (601), in Zone 5, PLANE 2 (603), and in Zone 8, PLANE 0 (605). As shown in FIG. 5, the zone boundaries have been shifted between from plane to plane to accommodate these bad blocks. More generally, both the number of planes and the number of zones can be a number of different values, although as discussed below there are various trade-offs involved in the choice of these values.

The boundaries of each zone are selected so that at least a minimum number of good blocks are available for writing in each plane of the zone. Each zone should contain at least a number of blocks sufficient to hold data from blocks necessary for optimal system operation. Any remaining spare blocks can be distributed evenly per zone per plane, where if the number of spares is not divisible by the number of planes, then the remaining extra blocks can be distributed evenly from the first zone. The process is performed independently for each plane, with a diagram of the chip and how it is divided shown in FIG. 5.

In the exemplary embodiment, it is preferred that the zone boundaries do not cross device boundaries. This constraint is due to the preference in memory for parallel operation in order to improve device performance, as described above in the discussion of the related art. In other embodiments, the planes can be distributed across multiple chips to further increase its flexibility and adaptability. For example, PLANE 0 (620), PLANE 1 (621), and PLANE 2 (622) may be formed on one die and PLANE 3 (623) on another.

Every chip in a multi-chip device can be zoned in a similar fashion, with the exception that the first (or other) chip (chip 0) may have reserved system blocks and one or more spare blocks may be assigned to the reserve area, thereby correspondingly reducing the number of available spares for the user data portion of this chip. The uses of the reserved system blocks are discussed further below with respect to another aspect of the present invention. There is no requirement that Block 0 be good. In fact, the firmware will tolerate bad blocks in the first 9 blocks of the chip.

The size of a zone is determined by a couple of factors. First, since a logical to physical translation table must be kept in the controller RAM, an attempt is made to keep the zone size small for controller cost reasons. Although dependent on the implementation, the present invention will generally need more area in RAM since in addition to storing the relation between zones and physical block numbers, it will now also contain information allowing zone size to vary from one plane to the next. It also takes time to build these tables since a page form each block must be read to establish its logical address when a zone is first accessed. An opposing factor is that it is expanded as large as is reasonable to more efficiently use the extra physical blocks in the erase pool and allow for more defects.

For example, a particular embodiment is based on each memory chip having four planes with 4092 user data blocks plus 4 system blocks, for a total of 4096. A set of sample calculations shows that both the amount of RAM to store a physical and the time to assemble this table decrease inversely with the number of zones: Five zones takes twice the amount for ten zones and three times the amount for fifteen zones. The defect tolerance also decreases in the same way. Consequently, a trade-off between these two effects must be chosen. For the described embodiment, a reasonable balance is to use an exemplary embodiment of 9 zones or the 10 zones as shown in FIG. 5.

The process of adjusting the zone boundaries can be done at a number of different times. For example, it can be performed at the time of memory test of the device to accommodate defective blocks in the fresh memory arrays. In this case, a signal from external to the system is sent to the controller, the bad blocks are determined and a zone tabled assembled. This table can then be stored in the reserved area of the non-volatile memory for future use. This aspect of the present invention improves device yield. Previously, if there were too many defective blocks in a zone, the zone would be unusable. Now, the boundaries can be shifted to save this zone. Similarly, it can also increase device life. For example, if a zone had a maximal number of bad blocks at test time, it would previously become unusable at the first additional block failure, whereas now the extra good blocks are redistributed.

This aspect of the invention can also be implemented in a dynamic manner to accommodate errors as they arise. This can be particularly useful for late in life of system as blocks begin to fail. Although the spare blocks may be evenly distributed among zones after an initial boundary adjustment at test time, new bad blocks will often not appear uniformly across a device. Non-uniform wear can result as one area cycles and wears more. There may also be a clustering of grown defects due to non-uniform processing and the device will again run out of erase blocks in some zones.

The dynamic allocation of spare blocks can be motivated by several sources. It may be done in response to a signal from the host based on, say, a time requirement. The host would issue a command to the controller that then goes ahead with the process. The controller itself could also initiate the process on its own, for example in response to an ECC result indicating a problem or to programming or erase difficulties.

Whatever the impetus, the controller will determine the defect locations in the memory array or arrays and determine the distribution of blocks to the zones to accommodate the defective blocks. As there may be data in a block that was formerly in one zone and is now to be reassigned to another zone, the data in this block will need to be moved to keep it in the same zone. If a number of defective blocks occur in a single zone, it will usually be easier on applications if the data movement and boundary reassignments are done in steps, for example moving boundaries by one block at a time. (When no data is present, such as at test time, the reassignment can all be done in one step.) This process is shown schematically in FIG. 6.

The boundary table is then updated by assembling the logical block to physical block conversion for the new boundary assignments. This table can subsequently be moved from the controller RAM to a reserved portion of the non-volatile memory. By storing the zone table in non-volatile memory, when the system receives an initializing command from the host, the initializing the memory system will include transferring the zone boundary table from the non-volatile memory to the controller's cache memory. The table can then be used to access the memory by zones.

FIG. 6 shows a portion of a plane with initial boundaries between zones 8 and 9 and between zones 7 and 8 by the broken lines indicated by A. In the figure, zone 9 is shown to have 5 bad blocks, 701-705. For example, this could be a portion of the array where the memory cells were poorly constructed due to a processing error and which have eventually failed resulting in an insufficient number of good blocks in the zone. Several good blocks need to be transferred from zone 8 to zone 9 by moving the boundary to the location indicated by C. As this will reduce the number of blocks in zone 8, a further adjustment may be need to transfer some blocks form zone 7 to zone 8 by moving that boundary to the location indicated there by B.

As the blocks indicated by 711 and 712 are likely contain data, this data have to be moved if their logical block numbers are to remain in the same zone and preserve the zone structure. As there may not be enough available space to move both blocks at once, the block 711 can be moved first and an intermediate boundary established between zones 8 and 9 as indicated there by B. To create additional room in zone 8 and allow its boundary with zone 7 to be moved from A to B, the data in block 721 needs to be similarly moved. Subsequently to moving the data in block 721 to zone 7 and establishing the boundary indicated there by B, the data in block 712 can be moved to zone 8 and the C boundary established.

As for the relative timings, if the additional space created by moving block 721 is need to move block 712, it is only necessary that block 721 is moved sometime before block 712. This could be after, at the same time as, or even prior to moving block 711. If there is no data in these blocks, for example at the time of testing, there is of course no data to move and the final boundaries can be established without intermediate steps.

FIG. 7 is a flowchart of the process. The process can be initiated in a number of ways. It can be start by an external signal (801), for example at test time or as decided by a host. The host can initiate the process based upon timing or number of operations, for example a number of erase/program operations. This sort of initiation can also originate with the controller itself. Another way the process can be initiated within the system itself is in response to an indication of defects in part of the array (802), for example due to an ECC result or failure to verify in a program or erase process.

The process itself begins with the controller evaluating the selected portions of the memory (803) to determine which, if any, blocks are defective. Based on this result, the controller determines the distribution of good blocks that will distribute the good blocks in a plane across the zones, as described above. This equalized the number of good blocks—or, more accurately minimizes the variation in the number of good blocks—as described above in order to produce the zone table (805). In the exemplary embodiment, a firmware implementation is used in the controller, although implementations using only hardware or software are possible variations. In a further set of variations, some or all of the boundary determination can be performed in the host.

As described with respect to FIG. 6, it may be necessary to move data that will be affected by boundary changes. This is done in step 807, after which the boundary is adjusted in step 809. As also described above with respect to FIG. 6, this process may be done in an incremental process (811). When no data is present, such at initial device testing, these steps are not needed.

At this point, the zone table is determined and the boundaries set in each plane and the actual process is done. The device can now be operated using the zone table to access the memory (813). Eventually, the process may be repeated based on the result of accessing the memory, as described with respect to step 802. Also, the updated zone table can also be stored in non-volatile memory (815), for example in the reserved portion, to maintain this information for future use. Although step 815 is shown in FIG. 7 to occur after step 813, it can be done any time after the table is established.

As mentioned above, although the discussion so far has referred mainly to embodiments using a charge storing device, such as floating gate EEPROM or FLASH cells, for the memory device, it can be applied to other embodiments, including magnetic and optical media. As the particulars of how the storage elements are read, are written, and store data do not enter into the main aspects of the present invention, the various aspects of the present invention may be applied to other memory types, including, but not limited to, sub 0.1 µm transistors, single electron transistors, organic/carbon based nano-transistors, and molecular transistors. For example, NROM and MNOS cells, such as those respectively described in U.S. Pat. No. 5,768,192 of Eitan and U.S. Pat. No. 4,630,086 of Sato et al., or magnetic RAM and FRAM cells, such as those respectively described in U.S. Pat. No. 5,991,193 of Gallagher et al. and U.S. Pat. No. 5,892,706 of Shimizu et al., all of which are hereby incorporated herein by this reference, could also be used.

Although the invention has been described with respect to various exemplary embodiments, it will be understood that the invention is entitled to protection within the full the appended claims.

It is claimed:
1. A non-volatile memory system, comprising:
a memory circuit, including:
one or more physical memory arrays, each of said one or more physical memory arrays having a plurality of non-volatile storage elements;

programming circuitry selectable connectable to the storage elements to write data content thereto;

read circuitry connectable to the storage elements to read data content stored therein; and erase circuitry connectable to the storage elements to erase data content stored therein, the one or more physical memory arrays each being formed of a plurality of physical blocks, wherein the storage elements within individual ones of the physical blocks are simultaneously erasable; and a memory controller circuit that controls writing of data into addressed blocks, reading data from addressed blocks and erasing data from one or more of addressed blocks at a time, wherein the one or more physical memory arrays are subdivided by the controller into logical zones each comprised of a plurality of physical blocks by introducing logical boundaries of the one or more physical memory arrays for address translation within which logical to physical block translations are performed for the plurality of physical blocks thereof, and where the logical zones correspond to contiguous physical spaces by introducing beginning and end physical block addresses for the logical zones, wherein the memory controller circuit can adjust said logical boundaries and update said correspondence in response to identifying one or more of said physical blocks as defective based on the distribution of the identified defective physical blocks while maintaining a correspondence of physical blocks to logical zones corresponding to contiguous physical spaces.

2. The memory system of claim 1, wherein the identifying of physical blocks as defective is based on testing data.

3. The memory system of claim 2, wherein the memory controller circuit performs testing of the physical blocks in response to a signal external to said memory system.

4. The memory system of claim 2, wherein said memory controller circuit further comprises error correction code (ECC) logic and performs testing of the physical blocks in response to an error correction code result.

5. The memory system of claim 1, wherein the memory controller circuit identifies a physical block as defective based on a program verification result.

6. The memory system of claim 1, wherein the memory controller circuit identifies a physical block as defective based on an erase verification result.

7. The memory system of claim 1, wherein the memory controller circuit updates said correspondence based on minimizing the variation in the number of non-defective physical blocks in said logical zones.

8. The memory system of claim 1, wherein the memory controller circuit further includes a volatile memory in which said correspondence is maintained.

9. The memory system of claim 8, wherein the memory controller circuit additionally maintains a copy of said correspondence in non-volatile memory.

10. The memory system of claim 1, wherein in response to updating said correspondence, the memory system rewrites user data stored in a first physical block into a second physical block, wherein said first physical block is part of a first logical zone prior to said updating and is part of second logical zone subsequent to said updating, and wherein said second physical block is part of said first zone subsequent to said updating.

11. The memory system of claim 10, wherein subsequent to rewriting user data stored in a first physical block into a second physical block, the memory controller circuit further updates said correspondence on the distribution of the identified defective blocks.

* * * * *